(12) United States Patent
Emoto

(10) Patent No.: US 8,405,401 B2
(45) Date of Patent: Mar. 26, 2013

(54) OPERATION STATUS DIAGNOSING DEVICE FOR EXTERNAL CONTROL MEANS

(75) Inventor: Hideaki Emoto, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 243 days.

(21) Appl. No.: 12/674,423

(22) PCT Filed: Jan. 9, 2009

(86) PCT No.: PCT/JP2009/050596
§ 371 (c)(1),
(2), (4) Date: Jun. 9, 2010

(87) PCT Pub. No.: WO2009/088099
PCT Pub. Date: Jul. 16, 2009

(65) Prior Publication Data
US 2011/0128012 A1 Jun. 2, 2011

(30) Foreign Application Priority Data
Jan. 11, 2008 (JP) .................. 2008-005076

(51) Int. Cl.
*G01R 31/02* (2006.01)

(52) U.S. Cl. .................. 324/537; 324/547; 324/127

(58) Field of Classification Search .................. 324/126, 324/127, 87, 119, 546, 537, 500, 726, 76.11, 324/547; 702/117, 108
See application file for complete search history.

(56) References Cited

U.S. PATENT DOCUMENTS

| | | | | |
|---|---|---|---|---|
| 5,995,387 A | * | 11/1999 | Takahashi et al. | 363/21.04 |
| 6,771,059 B1 | * | 8/2004 | Zwicker | 324/119 |
| 2005/0156540 A1 | * | 7/2005 | Ball | 315/307 |

FOREIGN PATENT DOCUMENTS

| | | | | |
|---|---|---|---|---|
| GB | 2439648 A | * | 1/2008 | |
| JP | 56012560 A | | 2/1981 | |
| JP | 8005708 A | | 1/1996 | |
| JP | 2000224752 A | | 8/2000 | |
| JP | 3083460 U | | 11/2001 | |
| JP | 2004198302 A | | 7/2004 | |
| JP | 2006023105 A | | 1/2006 | |
| JP | 2007209082 A | | 8/2007 | |

OTHER PUBLICATIONS

ISR for PCT/JP2009/050596 mailed Apr. 21, 2009.

* cited by examiner

*Primary Examiner* — Hoai-An D Nguyen
(74) *Attorney, Agent, or Firm* — Kanesaka Berner and Partners LLP

(57) ABSTRACT

A device for diagnosing operation status of an external control unit includes an insulation transformer, a signal generating unit, a first switch circuit constituting the external control unit connected to the secondary side of the insulation transformer, a second switch circuit connected to the intermediate tap of the primary winding of the insulation transformer, and a second switch circuit including a switch and a resistance, a detection circuit for detecting operation status of the external control unit, and a current measuring unit connected to the second switch circuit. The detection circuit includes a diode and a resistance and is connected to the secondary side of the insulation transformer. The current measuring unit measures a current flowing through the switch and/or the resistance and uses the measured current to diagnose the operation status of the external control unit.

7 Claims, 6 Drawing Sheets

Fig. 7A

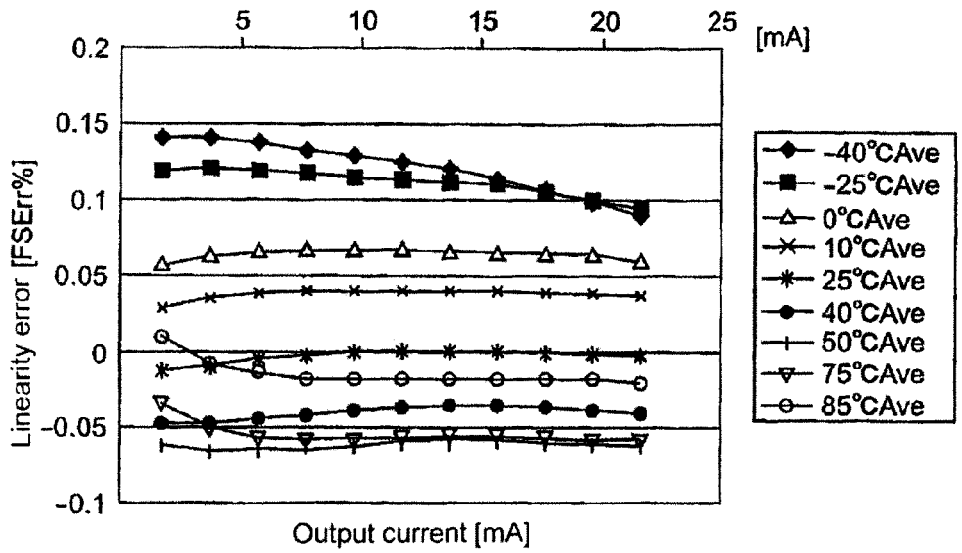

Transfer characteristic factor at 25°C taken as reference value

Fig. 7B

| Core material | | | PC95 |
|---|---|---|---|
| | Maker | Maker | TDK |
| | Initial permeability | μi | 3300 |
| | Amplitude permeability | μa | – |
| | Unit core loss | Pcv [kW/m³] | 290/@100°C |
| | Saturation magnetic flux density | Bs [nT] | 410 |
| | Residual magnetic flux density | Br [nT] | 60 |
| | Coersive force | Hc [A/m] | 6.5 |
| Core size | | | EE8 |
| | Core constant | C1 [nm⁻¹] | 2.75 |
| | Effective cross section | Ae [nm²] | 7 |
| | Effective magnetic path | Le [nm] | 19.2 |
| | Effective volume | Ve [nm³] | 134 |
| | AL value (without gap) | AL [nH/N²] | 610 |
| Type of winding frame | | | BE8-116CPHFR |
| | Cross section of widing | Aw [nm²] | 5.3 |
| | Average length of widing | Lw [nm] | 19.9 |
| | Width of widing frame | C [nm] | |
| | Number of pins | | 6 |

| | | Volume number | Peak voltage | Average voltage |
|---|---|---|---|---|
| Primary winding | P1 | 44 | 0.12 | 0.08 |
| | P2 | 44 | 0.12 | 0.08 |
| Secondary winding | S1 | 110 | 0.05 | 0.03 |

US 8,405,401 B2

OPERATION STATUS DIAGNOSING DEVICE FOR EXTERNAL CONTROL MEANS

TECHNICAL FIELD

The present invention relates to a device for diagnosing operation status of an external control means, particularly a diagnosing device for confirming whether a signal is transmitted correctly to a relay contact operated by a binary signal of ON/OFF or an ON/OFF means composed of semiconductor material used as external control means to control plants and equipment and diagnosing the soundness of the circuit such as whether a breaking of wire or short circuit has not occurred in the circuit.

BACKGROUND ART

There have been known a relay contact operated by a binary signal of ON/OFF or an ON/OFF means composed of semiconductor material used as external control means to control plants and equipment. In such an external control means, a signal sending side (hereafter referred to as the instruction side) from which signals are sent to the plant and equipment (hereafter referred to as the plant side) in which measurement, drive, or control is performed upon receiving the signals, is insulated from the plant side depending on use for the purpose of preventing affections of the signal voltage on the human body or evading affections of noise. This is generally done by adopting a photocoupler, signal insulation relay, insulation amplifier, and insulation transformer to send signals from the instruction side and to send measurement result from the plant side to the instruction side, and adopting an insulation transformer as a power source transformer to supply electric power.

In recent years, there has been an increased demand for performing soundness diagnosis of circuits in the field of instrumentation and measurement for the purpose of raising reliability of the system by confirming soundness of output signals and circuit wiring, that is, by confirming whether the measurement and control means are operating correctly as instructed and whether there is a breaking of wire or short circuit occurred in the circuit.

FIG. 8 and FIG. 9 respectively shows an example of conventional drive circuit of an external control means such as a relay contact operated by a binal signal of ON/OF or ON/OFF means composed of semiconductor material, and that added with a circuit for diagnosing soundness of the drive circuit.

In FIG. 8 and FIG. 9, binary signals 153 and 154 for driving and controlling external control means 151 and 152 (hereafter referred to as contacts depending on circumstances) are inputted respectively to photoMOS relays 155 and 156, for example, used for insulating the instruction side from the plant side, and sent to the contacts 151 and 152 to drive them. A broken line 157 indicates an insulation barrier to insulate the plant side from the instruction side by the photoMOS relays 155 and 156. The signals sent to the contacts 151 and 152 are also insulated by the insulation barrier.

In the circuit of FIG. 8, the binary signals 153 and 154 to switch on/off the contacts 151 and 152 as external control means are merely sent to the photoMOS relays 155 and 156, whether the photoMOS relays 155, 156, contacts 151, 152 are operating normally, or whether there is a breaking of wire or short circuit occurred, can not be detected.

A dedicated circuit is required in order to perform soundness diagnosis of the circuit such as to know whether the photoMOS relays 155, 156, contacts 151, 152 are operating normally, and whether a breaking of wire or short circuit has not occurred.

An example when a dedicated circuit is provided is shown in FIG. 9 in a block diagram. In FIG. 9 are provided electric power source circuits 101a and 101b which are not provided in the circuit of FIG. 8. A diagnosing circuit comprised of a microcomputer is needed to diagnose operation status of each of the contacts, and the electric power source circuits 101a and 101b are necessary respectively to supply electric power to drive each of the diagnosing circuits. Each of the electric power source circuits 101a, 101b comprises an electric power source 102a, 102b, pulse generating circuit 103a, 103b, insulation transformer 104a, 104b, rectifying circuit 105a, 105b, and constant voltage circuit 106a, 106b.

The binary signal 153, 154 for switching on/off the contact 151, 152 is inputted to the photocoupler 155, 156 used for the purpose of insulating the plant side from the instruction side similarly to the case of FIG. 8, then converted into an ON/OFF signal to switch on/off the contact by a monitoring circuit 158a, 158b for monitoring the contact signal and condition of the contact for reading over, the monitoring circuit being supplied with electric power from the electric power source circuit 101a and 101b, to be sent to the contact 151, 152 to drive each contact.

Operation status such as whether the contact 151, 152 is operating as instructed and whether there is a breaking of wire or short circuit occurred is diagnosed by the monitoring circuit 158a, 158b and outputted from the photocoupler 159a, 159b as a read over signal sent from the plant side to the instruction side.

However, in the circuit of FIG. 9, the insulation electric power source circuit 101a, 101b, and monitoring circuit 158a, 158b for monitoring operation status of the driving signal for driving the external control means and the external control means are provided for each contact 151 and 152 in the plant side, so, manufacturing cost increases very much and actual example of use is limited to very special use.

That is the conventional circuit to perform driving of circuit and concurrently diagnosis of circuit soundness whether the signal for switching on/off the external control means such as a relay contact actuated by a binary signal of ON/OFF or ON/OFF means composed of semiconductor material used for the control of a plant or equipment is correctly transmitted to the external control means, whether the external control means is operating normally, and whether there is a breaking of wire or short circuit occurred. With this conventional circuit construction for diagnosing operation status of the external control means, there have been problems as follows:

(A) An electric power source circuit and soundness diagnosing circuit must be added to perform soundness diagnosis separately from the transmitting circuit of ON/OFF signal to the contact, so, the number of parts increases and circuit construction becomes complicated, resulting in increased manufacturing cost.

(B) When there are a plurality of contacts and the contacts must be insulated from one another as shown in FIG. 9, a soundness diagnosis circuit must be provided for each of the contacts, and when the contacts are located distantly from one another, an expensive insulation electric power source circuit must be provided for each of the contacts, so, manufacturing cost increases further.

(C) To cope with this, when a single expensive insulation power source is provided for common use for each of the contacts, and when the contacts are located distantly from one another, difference in voltage occurs due to difference in voltage drop caused by difference of length of signal wires. Therefore, it has been necessary principally to perform diagnosis of contacts located near to one another.

As to the art for detect braking of wire, there are disclosed for example in patent literature 1(Japanese Laid-Open Patent Application No. 2006-023105) a method of detecting breaking of wire by applying a pulse signal to the wire, and comparing the current wave shape measured with the reference current wave shape to judge the presence or absence of breaking of wire from difference in both the wave shapes, and in patent literature 2 (Japanese Laid-Open Patent Application No. 2004-198302) a circuit for detecting breaking of wire by applying a pulse signal for checking via an impedance component to the signal wire for detecting breaking of wire, and comparing the signal obtained from the signal wire with the pulse signal for checking to judge the presence or absence of breaking of wire.

As to diagnosis of electric circuits, there is disclosed for example in patent literature 3(Japanese Laid-Open Patent Application No. 8-005708) a method of diagnosing electric circuits and diagnosing device used for the method. With the method, conditions of electric apparatuses are diagnosed for the purpose of improving efficiency of diagnosis operation by facilitating measurement record management and further decreasing occurrence of man-caused errors, by reading out information written and stored in a nonvolatile memory concerning measurement results of characteristics or things concerning measurement of the electric apparatuses, or measurement results of characteristics or things concerning measurement of the electric apparatuses, and comparing the read-out information with the information of-the-moment concerning measurement results of characteristics or things concerning measurement of the electric apparatuses.

However, with the art taught in the patent literature 1 and 2, means for applying pulse signals and a memory for memorizing reference current wave shape are needed, and with the electric circuit diagnosing device disclosed in the patent literature 3, a memory memorized information concerning measurement results of characteristics or things concerning measurement of the electric apparatuses is needed, and further a means for measuring characteristics of the circuit and a means for comparing the measurement result with the reference data, resulting in complicated composition. Therefore, problems cited in the items (A)~(C) cannot be solved by these art.

SUMMARY OF THE INVENTION

Therefore, the object of the present invention is to provide a device for diagnosing operation status of an external control means, with which a signal showing operation status of the external control means or occurrence of a breaking of wire or short circuit, is transmitted by the same means for transmitting the electric power, and transmission of measurement result and diagnosis of soundness of the circuit can be performed with high accuracy by simple construction without increase of the number of parts and complication of the circuitry, thereby preventing increase in manufacturing cost.

To attain the object, the present invention proposes a device for diagnosing operation status of an external control means such as a relay contact or ON/OFF means composed of semiconductor material operated by an ON/OFF signal transmitted via an insulation means, comprising; an insulation transformer having an intermediate tap at a midpoint of its primary winding as said insulation means, a signal generating means for generating a periodically vibrating voltage including a pulse voltage and alternating voltage connected to the primary side of the insulation transformer, a first switch circuit constituting the external control means connected to the secondary side of the insulation transformer, a second switch circuit which is connected to the intermediate tap of the primary side of the insulation transformer, is operated by said ON/OFF signal, and renders the output of the signal generating means into a voltage for switching on/off the first switch circuit, a detection circuit for detecting operation status of the external control means which is connected to the secondary side of the insulation transformer and to which a current flows when the first switch circuit is "ON" state, and a current measuring means connected to the second switch circuit to measure a current of the primary side of the insulation transformer; whereby operation status of the external control means is diagnosed based on the measurement result of a change of the current of the primary side of the insulation transformer caused by the current flowing in the detecting circuit for detecting operation status of the external control means.

With the device, the first switch circuit which composes an external control means and is connected to the secondary side of the insulation transformer is switched on/off by the electric power sent via the second switch circuit which is connected to the primary side of the insulation transformer and operates on an ON/OFF signal, change of current in the primary side caused by the consumption of electric power by the external control means's operation status detection circuit is measured, and operation status of the external control means is diagnosed based on the measurement. When there is a breaking of wire in the first switch circuit, current does not flow in the external control means's operation status detection circuit, when there is a short circuit, a current larger than usual flows. The primary side current of the insulation transformer changes in accordance with said current, so, ON/OFF status of the first switch circuit constituting the external control means, and existence or nonexistence of a breaking of wire or short circuit, can be estimated. Therefore, a device for diagnosing operation status of an external control means can be composed which needs not to provide an electric power source, insulation means, and monitoring circuit of drive status of external control means for every external control means as is needed in the conventional device; is very simple in construction without increase in the number of part preventing increase of manufacturing cost; and can diagnose operation status of the external control means with high accuracy.

By composing such that the second switch circuit has a function to switch the amplitude of the output of the signal generating means to be applied to the primary side of the insulation transformer to a first voltage with which the first switch circuit is switched on and a second voltage with which the first switch circuit is switched off, the first switch circuit which is an external control means can be switched on/off and at the same time occurrence of braking of wire or short circuit in the circuit of the external control means (the first switch circuit) can be detected.

Further, by geminating the first switch circuit and the detection circuit for detecting operation status of the external control means, when the circuit is used in a use in which cutting off the contacts is safer for example, and one of the first switch circuit breaks down, the circuit becomes increased in safety by cutting off another first switch circuit.

Furthermore, by composing such that an end of the secondary winding of the insulation transformer is earthed, the first switch circuit is composed of a N-type and a P-type transistor, both the transistors are arranged at each half wave position in a full wave rectifying circuit connected to the secondary side of the insulation transformer, and each gate of each of the transistors is connected to the earth terminal, it is possible that, when the negative side transistor is broken, which of the positive side or negative side FET, i.e. which of the N-type or P-type FET is broken can be known.

As has been described heretofore, according to the invention, a device for diagnosing operation status of an external control means can be composed which needs not to provide an electric power source, insulation means, and monitoring circuit of drive status of external control means for every external control means as is needed in the conventional device; is very simple in construction without increase in the number of part preventing increase of manufacturing cost; and can diagnose operation status of the external control means with high accuracy.

BRIEF DESCRIPTION OF THE DRAWINGS

FIG. 7A is a graph of a test result showing linearity error of transfer characteristic of the transformer used in the invention (linearity error for various core temperature between −40~85° C. taking the transfer characterization factor at 25° C. as the reference value), and FIG. 7B is table showing the specifications of the transformer used in the test.

DETAILED DESCRIPTION OF THE PREFERRED EMBODIMENTS

Preferred embodiments of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 1:
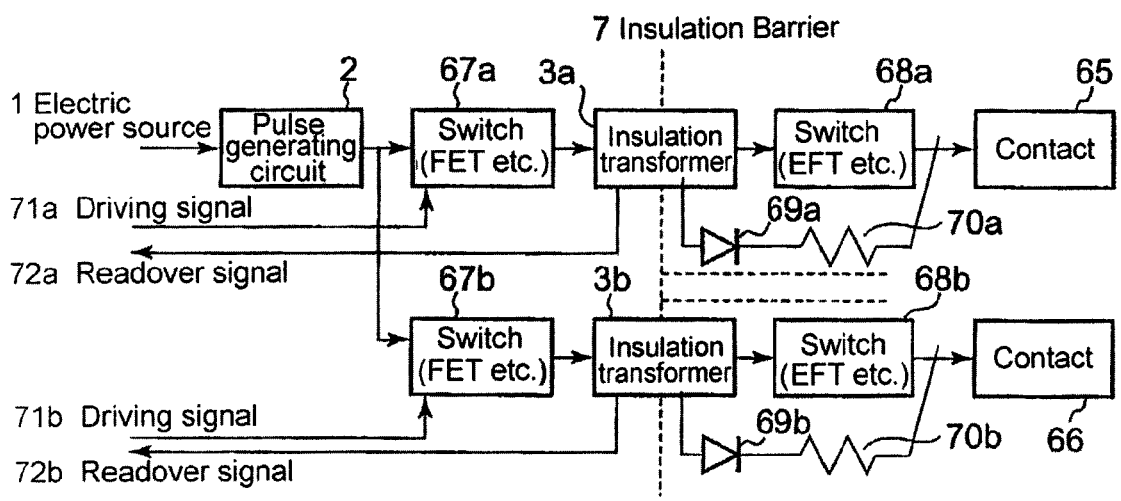
FIG. 1 is a block diagram of a circuit according to the invention for driving an external control means (contact) such as a relay contact or ON/OFF switching means made of semiconductor, which actuates upon receiving an ON/OFF signal.
Figure 2:
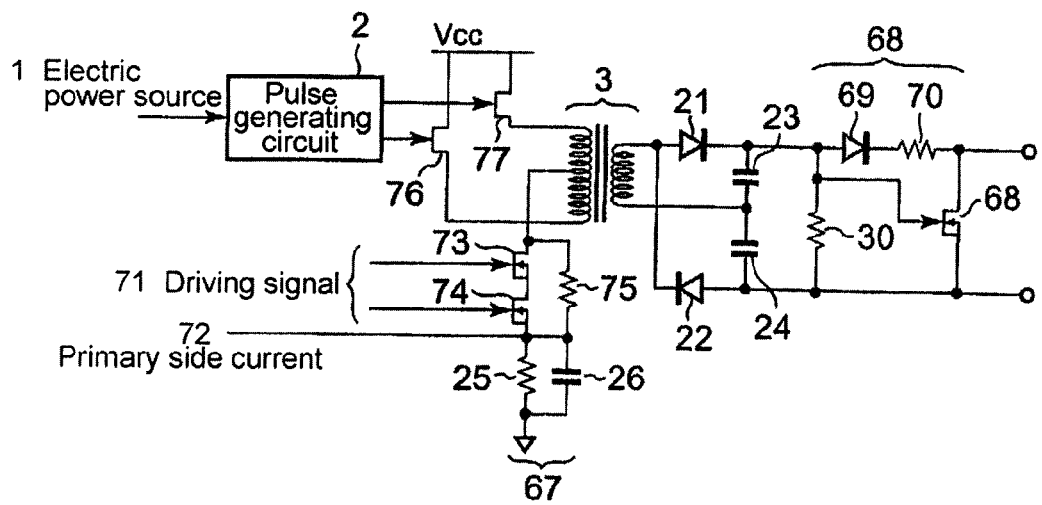
FIG. 2 is a diagram of a circuitry according to the invention for driving an external control means (contact) such as a relay contact or ON/OFF switching means made of semiconductor, which actuates upon receiving an ON/OFF signal.

FIG. 1 and FIG. 2 shows respectively a circuit block diagram and a circuitry of the device for diagnosing operation status of an external control means according to the invention.

Figure 8:
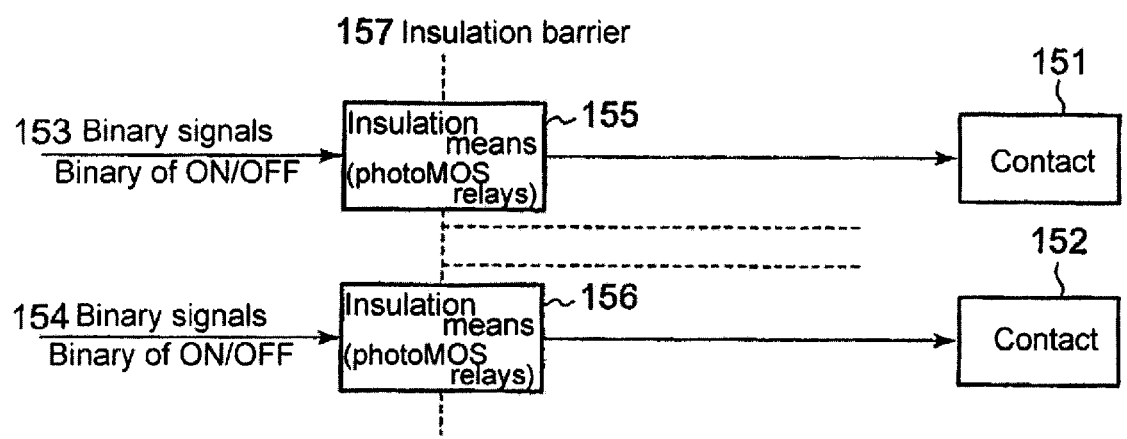
FIG. 8 is a block diagram of a conventional circuit for driving external control means (contact) 151 and 152 upon receiving an ON/Off signal respectively.
Figure 9:
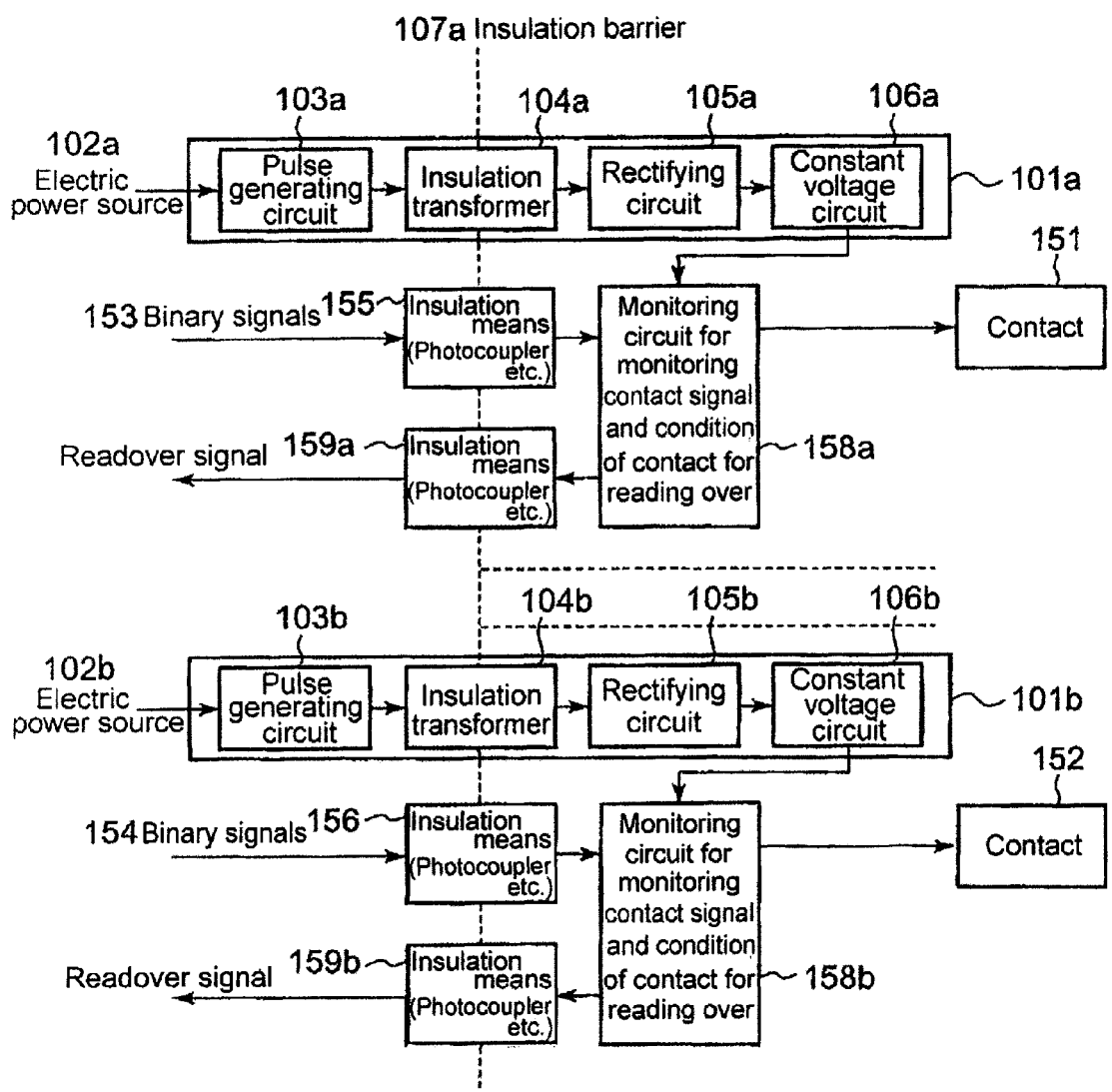
FIG. 9 is a block diagram of a conventional circuit provided with a circuit for performing diagnosis of signal status and concurrently driving external control means 151 and 152 upon receiving an ON/Off signal respectively.

The circuit shown in FIG. 1, 2 is configured such that a signal for switching on/off the relay contact or ON/OFF means composed of semiconductor material as an external control means used for the control of a plant or equipment as explained referring to FIG. 8 is transmitted by an electric power transmission means and concurrently diagnosis of circuit soundness whether the signal is transmitted correctly to the external control means and the external control means is operated normally, and whether there is a breaking of wire or short circuit occurred in the circuit can be performed.

In FIGS. 1 and 2, reference numeral 1 is an electric power source, 2 is a pulse generating circuit, 3a(3b) is an insulation transformer, 21 and 22 is a diode, 23 and 24 is a condenser, 30 is a resistance, a broken line denoted by reference numeral 7 indicates an insulation barrier for insulating the instruction side from the plant side such as a plurality of external control means 65(66) (hereafter referred to as the contacts depending on circumstances). Reference numeral 25(26) is a resistance and condenser respectively for measuring the primary side current of the insulation transformer 3, 65(66) is a relay contact driven by a binary signal or ON/OFF means composed of semiconductor material as an external control means, 67a (67b) is a second switch circuit comprising FET's (Field Effect Transistor, reference numeral 73(74) in FIG. 2), etc., is a first switch circuit comprising FET's (reference numeral 68 in FIG. 2), 69a(60b) is a diode, 70a(70b) is a resistance, 71a(71b) is a driving signal for switching on/off the contact 65(66), and 72a(72b) is a the primary side current (read over signal) of the insulation transformer 3a(3b). Reference numeral 73 and 74 in FIG. 2 is a FET for applying to the contact 65(66) connected to the secondary side of the insulation transformer 3a(3b) a voltage to switch on the contact 65(66) and a small voltage to switch off the contact 65(66). Reference numeral 75 is a resistance, 76 and 77 is a FET for applying to both the ends of the primary winding of the insulation transformer 3a(3b) an ON/OFF pulse alternately.

The binary driving signal 71a(71b) which switches on/off the contact 65(66) as an external control means is inputted to the second switch circuit 67a(67b) comprising the FET 73(74) (see FIG. 2). The second switch circuit 67a(67b) is switched on/off by the driving signal 71a(71b), and the circuit is composed so that when the circuit is switched on, a higher voltage is applied and when switched off, a lower voltage is applied to the primary side of the insulation transformer 3a(3b). From the secondary side of the insulation transformer 3a(3b) is outputted higher voltage when the circuit is switched on and lower voltage is outputted when the circuit is switched off.

The first switch circuit 68a(68b) is switched on/off in accordance with the higher/lower voltage, and the contact 65a(65b) as an external control means is driven in accordance with the voltage. The diode 69a(69b) and resistance 70a(70b) compose an external control means's operation status detection circuit for applying a current for confirming whether the contact 65(66) is actually switched on. When the contact 65(66) is switched on, a current flows via the diode 69a(69b) and the resistance 70a(70b), and when the contact is switched off, there flows no current.

Therefore, when the contact 65(66) is switched on and a current flows via the diode 69a(69b) and the resistance 70a (70b), a current corresponding to said current flows in the primary side of the insulation transformer 3a(3b), so, by measuring the current as a read over current by a current measuring means not shown in the drawing, the current flowing in the secondary side can be judged, by which soundness diagnosis of circuit such as whether the signal for switching on/off the contact which is an external control means used for controlling the plant or equipment is correctly transmitted to the external control means, and whether is a braking of wire or short circuit occurred in the circuit, can be performed.

To be more specific, with the device for diagnosing operation status of an external control means of the invention, when the contact 65(66) is switched on, power is consumed by a current flowing through the diode 69a(69b) and resistance 70a(70b), a current corresponding to the power consumed flows in the primary side of the insulation transformer 3a(3b). By measuring said current, the current flowing through the contact 65(66) of the external control means or consumed by the means is estimated.

When there is a braking of wire in the first switch circuit 68a(68b), a current does not flow, and when there is a short circuit, a current larger than normal flows to the external control means's operation status detection circuit. Therefore, the current of the primary side of the insulation transformer 3a(3b) changes in accordance with said current, and by measuring this current, the status of ON/OFF of contact 65(66) as the external control means, existence of a breaking of wire or short circuit can be estimated. In this way, status of the object connected to the circuit including its soundness can be acknowledged without providing additional insulation means.

Next, FIG. 2 will be explained. In FIG. 2, the diode 21 and 22, and condenser 23 and 24 are connected to the secondary side of the insulation transformer 3 so that an full wave rectifying circuit is composed and a voltage is applied from the resistance 30 to the gate of the FET 68 as the first switch circuit for composing a contact connected to the output side of the full wave rectifying circuit. In the primary side of the insulation transformer 3, a pulse from the pulse generating circuit 2 operated by the electric power supplied from the electric power source 1 is inputted to the FET 76 and 77 supplied with electric power from an electric power source $V_{cc}$. The voltage $V_{cc}$ is applied to both the ends of the primary winding of the insulation transformer 3 alternately in accordance with alternating ON state of the FET 76 and 77.

On the other hand, the second switch circuit shown in FIG. 1 by reference numeral 67a(67b) is comprised of the FET 73 and 74 in FIG. 2. The circuit is switched on/off in accordance with the input of the ON/OFF driving signal 71 to the gate of each FET. When the driving signal 71 is ON, a current from the intermediate tap of the primary side of the insulation transformer 3 flows only passing through the resistance 25, and when the driving signal 71 is OFF, the current from the intermediate tap flows passing through the resistance 25 and the resistance 75. Therefore, when the driving signal 71 is "ON", a higher voltage is applied to the primary side, and when the driving signal 71 is "OFF", a lower voltage is applied to the primary side.

When the second switch circuit is "ON" (that is, when the driving signal 71 is "ON"), in the secondary side of the insulation transformer 3, a voltage from the pulse generating circuit 2 is raised in voltage, rectified by the diode 21 and 22 composing a rectifying circuit, smoothed by the condenser 23 and 24, and the FET 68 as the first switch circuit become "ON" state because of the presence of the resistance 30. When the FET 68 as the first switch circuit also serving as the contact 65(66) in FIG. 1 is switched on, a current flows through the diode 69a(69b) and resistance 70a(70b), and a current corresponding to said current flows in the primary side of the insulation transformer 3. By measuring this primary side current 72 by an ammeter not shown in the drawing, the soundness of the circuit including whether the contact 65(66) is operating normally can be acknowledged.

Figure 3:
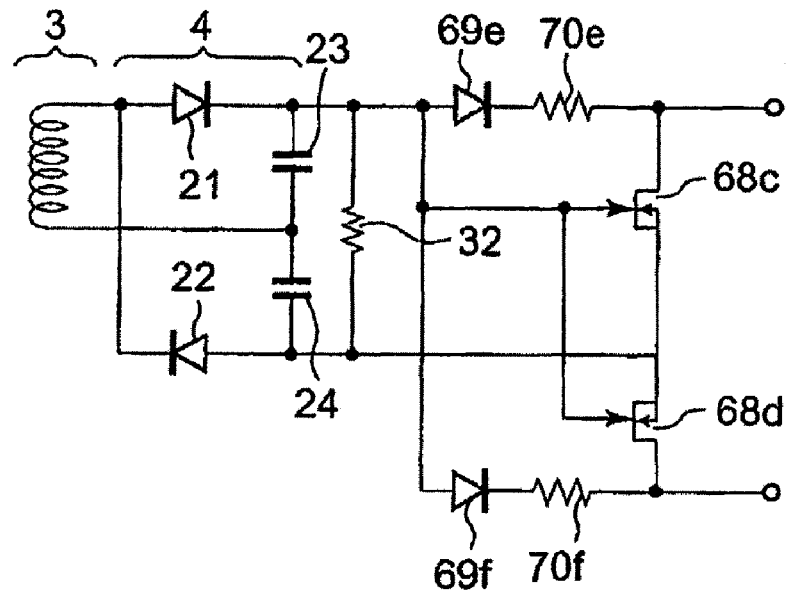
FIG. 3 is another embodiment of the first switch circuit 68 in FIG. 2.
Figure 4:
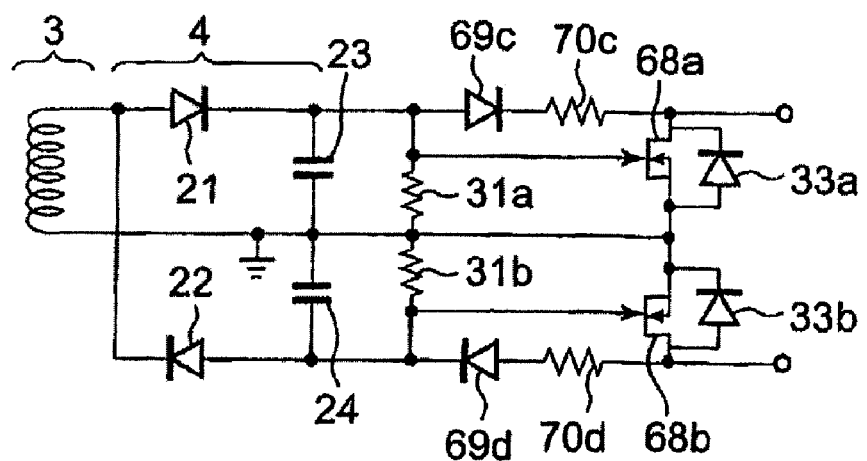
FIG. 4 is yet another embodiment of the first switch circuit 68 in FIG. 2.

FIG. 3 and FIG. 4 is respectively another embodiment of the first switch circuit 68 in FIG. 2. In the drawings, constituent elements similar to those of FIG. 2 are denoted by the same reference numerals and simple explanation will be given. Reference numeral 3 is a secondary side of the insulation transformer, 4 is a rectifying circuit, 21 and 22 is a diode and 23 and 24 is a condenser constituting the rectifying circuit 4. Reference numeral 31a, 31b, and 32 is a resistance, 33a and 33b is a diode, 68a, 68b, 68c, and 68d is a FET, 69c, 69d, 69e, and 69f is a diode, and 70c, 70d, 70e, and 70f is a resistance.

First, the circuit of FIG. 3 is composed such that, the diodes 21 and 22, condensers 23 and 24 arranged to composes an full wave rectifying circuit are connected to the secondary side of the insulation transformer, to this circuit is connected the two FET's 68a and 68b as a contact for constituting a first switch circuit in series with polarity opposite to each other so that the contacts serve as nonpolar contacts. To be more specific, the secondary side voltage is applied to both the gates of the FET's 68c and 68d as the first rectifying circuit constituting the contact connected to the output side of the full wave rectifier constituted by the diodes 21 and 22 and condensers 23 and 34, so, when the second switch circuit is "ON" (i.e. when the driving signal 71 is "ON"), both the FET's 68c and 68d become "ON", and so a means driven by the contact can be connected without taking polarity into consideration. In this case, when one of the FET's breaks down, a circuit increased in safety can be obtained by cutting off the other contact, for example when the circuit is used in a use in which cutting off the contacts is safer.

The circuit of FIG. 4 is composed such that, two FET's 68a and 68b as a contact for constituting a first switch circuit 68 are of N-type and P-type, and the N-type and P-type FET's 68a and 68b are arranged at each half wave position in the full wave rectifier circuit 4 constituted by the diodes 21 and 22 and condensers 23 and 24 connected to the secondary side of the insulation transformer 3 so that the positive (+) sides and negative (−) sides thereof correspond to each other, so that only when both the FET's are "ON", the FET's work as a contact, that is to say, the external control means's operation status detection circuit is geminated, thereby increasing reliability. In this circuit, an end of the secondary winding is grounded, the FET's 68a and 68b of N-type and P-type constituting the first switch circuit are provide at each half wave position in the full wave rectifying circuit respectively, and both the gates of the FET's 68a and 68b of N-type and P-type are connected to the earth terminal of the secondary side of the insulation transformer.

Therefore, in the circuit of FIG. 4, the earth terminal of the secondary side of the insulation transfer is 0V and electric charges of reverse polarity are accumulated respectively in the condensers 23 and 24. Therefore, when the second switch circuit is "ON" (i.e. when the driving signal 71 is "ON"), the FET's 68a and 68b become "ON" in the positive (+) side and negative (−) side respectively, so, when the negative side transistor is broken, which of the positive side or negative side, i.e. which of the N-type or P-type FET is broken can be known.

When using an electric power source without constant voltage circuit in this way, measuring the change of current in the primary side of the transformer caused by the consumption of the electric power which occurs due to performing diagnosis of the operation status of the external control means via the transformer, i.e. due to operation of the external control means, and estimating the operation status of the external control means base on the measurement, there occurs a problem accuracy of estimating the current flowing in the external control means as a driven object. Particularly, in the circuit system like this, energy loss in the insulation transformer becomes an error for the transmitted energy. However, when the error in the signal transmission is smaller than a required accuracy range, there is no problem. For example, when error of about 0.2%~0.25% is permissible, conventional transformer can be adopted.

When more precision is required, for example, error must be smaller than 0.1%, change of core loss depending on temperature of the transformer becomes most problematic. However, when the core loss is nearly constant in relation to temperature, it is no matter to judge the measurement result with high accuracy taking temperature into consideration, and measurement and transfer of analog signals is made possible with high accuracy.

Figure 5:
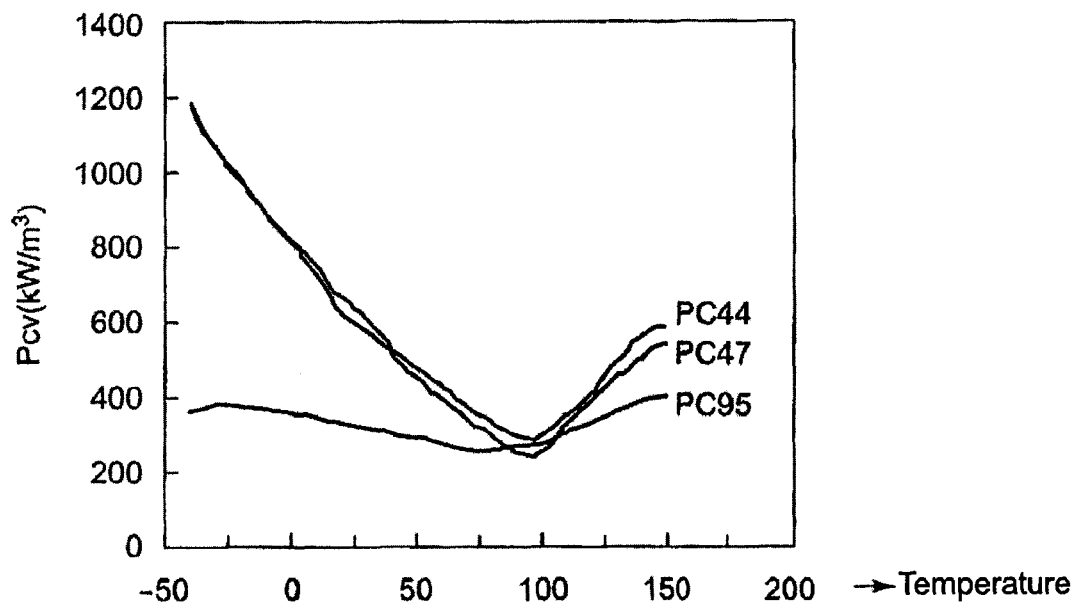
FIG. 5 is a graph showing core loss (electric power loss) vs. temperature characteristic of the core material used in the transformer of the invention.

FIG. 5 is a graph showing core loss characteristic (loss power (kW/cm$^3$) vs. temperature (° C.)) of several core materials. Core materials PC44 and PC47 of TDK Ltd. made which has a peak value at near 100° C., however, PC95 also of TDK Ltd. made has a relatively flat core loss characteristic. In the invention, PC95 was adopted as the core material of the insulation transformer. By this, a signal status diagnosing device can be provided which performs diagnosis of the status of signals in the measurement and control means in the driven object with high accuracy.

Figure 6:
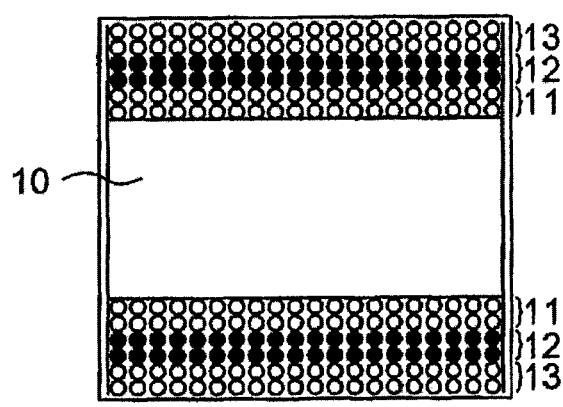
FIG. 6 is a pattern diagram showing winding of the primary and secondary coil around the core of the transformer used in the invention.

Further, the inventors of the application composed a transformer such that an intermediate tap is provided in an intermediate part of the primary winding, a current measuring means is connected to the intermediate tap, and change of primary side current caused by consumption of current supplied to the secondary side. As shown in FIG. 6, the primary coil is divided into an anterior half 11 and posterior half 13 such that a secondary coil 12 is sandwiched by both the primary coil 11 and 13, and the intermediate tap is taken out from the center of the primary coil. The inventors found out that a favorable signal transfer characteristic can be obtained with this composition of a transformer using PC95 as core material.

FIG. 7A is a graph showing a test result. The test was performed composing a distributor-isolation-amplifier using a insulation transformer composed using PC95 of TDK made as core material and arranging primary and secondary windings as shown in FIG. 6. Linearity and temperature drift were measured.

Specification of the insulation transformer used in the test is shown in the table of FIG. 7B. Measurement was performed using a precision resistance of accuracy of 10 ppm/° C.

In FIG. 7A is shown linearity errors of transfer characteristics for temperatures between −40~85° C., in which output currents (mA) of the distributor-isolation-amplifier are plotted as the abscissa and full scale errors % (4~20 mA is taken as 100%) are plotted as the ordinate, with the transfer characteristic factor at 25° C. taken as the reference value.

In the case of the conventional transformer composed by using PC44 or PC47 as core material to have a single primary coil not divided in two as shown in FIG. 6 and a secondary coil wound over the primary coil, linearity is ±0.05% or smaller, and about ±0.25% under environment of 0~60° C. Therefore, as can be recognized from FIG. 7A that, by composing the insulation transformer as described before, linearity of ±0.01% or smaller, about ±0.1% under environment of 0~85° C., and about 0.15~−0.1% under environment of −4~85° C. can be attained. It is thinkable that further improvement in accuracy and temperature characteristic can be attained by innovations in shape and size and increase of the number of winding of the insulation transformer. By adopting the insulation transformer like this, diagnosing of the signal status of the actuator can be performed with high accuracy by simple circuitry.

INDUSTRIAL APPLICABILITY

According to the invention, provision of means for diagnosing operation status of an external control means, which has been hesitated in the past because of increase in manufacturing cost, can be implemented with simple construction and without increase in the number of constituent elements, complication of the circuit configuration, and increase in manufacturing cost. The invention can be applied easily to an electric circuit which is required particularly to be highly reliable.

The invention claimed is:

1. A device for diagnosing operation status of an external control unit, said device comprising:

an insulation transformer having a primary side, a secondary side and an intermediate tap at a midpoint of the primary winding, a signal generating unit for generating a periodically vibrating voltage including a pulse voltage and alternating voltage, the signal generating unit connected to the primary side of the insulation transformer, a first switch circuit connected to the external control unit and to the secondary side of the insulation transformer, a second switch circuit which is connected to the intermediate tap of the primary winding of the insulation transformer, is configured to convert an output of the signal generating unit into a voltage for switching ON/OFF the first switch circuit, and comprises a switch and a resistance, the switch and the resistance being connected to the intermediate tap in parallel with each other, the switch configured to be switched by an ON/OFF signal, a detection circuit for detecting the operation status of the external control unit which is connected to the secondary side of the insulation transformer in series with the first switch circuit and to which a current flows when the first switch circuit is in an "ON" state while the current does not flow when the first switch circuit is in an "OFF" state, and a current measuring unit connected to the second switch circuit and configured to measure a current flowing through the switch or the resistance and to diagnose the operation status of the external control unit.

2. A device according to claim 1, wherein said second switch circuit is configured to switch an amplitude of the output of the signal generating unit applied to the primary side of the insulation transformer to a first voltage to turn ON the first switch circuit and to a second voltage to turn OFF the first switch circuit.

3. A device according to claim 1, wherein the first switch circuit and the detection circuit for detecting operation status of the external control unit are geminated.

4. A device according to claim 3, further comprising:

a full wave rectifying circuit connected to the secondary side of the insulation transformer;

wherein a terminal of the secondary winding of the insulation transformer is earthed, the first switch circuit includes of an N-type transistor and a P-type transistor, each of the transistors is arranged at a corresponding half wave position in the full wave rectifying circuit, and the gate of each of the transistors is connected to the earth terminal.

5. A device according to claim 1, further comprising:
a full wave rectifying circuit connected to the secondary side of the insulation transformer; and
a second resistance connected to an output of the full wave rectifying circuit, wherein the first switch circuit includes a transistor connected in parallel with the second resistance and in series with the detection circuit,
wherein a gate of the transistor is connected to the output side of the full wave rectifying circuit.

6. A device according to claim 1, wherein
the insulation transformer comprises a core, a primary coil on the primary side and a secondary coil on the secondary side,
the primary coil includes a first part between one end of the primary coil and the intermediate tap, and a second part between another end of the primary coil and the intermediate tap, and
the secondary coil is winded around a core and is sandwiched between the first part and the second part of the primary coil.

7. A device according to claim 1, wherein the detection circuit includes a diode and a further resistance connected in series.

* * * * *